(12) United States Patent
Abe et al.

(10) Patent No.: US 9,659,906 B2
(45) Date of Patent: May 23, 2017

(54) SEMICONDUCTOR DEVICE (71) Applicant: Renesas Electronics Corporation, Kawasaki-shi (JP)

(72) Inventors: Youichi Abe, Kawasaki (JP); Yuko Sato, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/797,092

(22) Filed: Jul. 11, 2015

(65) Prior Publication Data

US 2016/0086870 A1 Mar. 24, 2016

(30) Foreign Application Priority Data

Sep. 19, 2014 (JP) .................................. 2014-191224

(51) Int. Cl.
*H01L 23/367* (2006.01)
*H01L 23/00* (2006.01)
(Continued)

(52) U.S. Cl.
CPC ........ *H01L 25/0655* (2013.01); *H01L 23/367* (2013.01); *H01L 23/4334* (2013.01); *H01L 24/09* (2013.01); *H01L 24/32* (2013.01); *H01L 24/49* (2013.01); *H01L 24/73* (2013.01); *H01L 23/3128* (2013.01); *H01L 23/49827* (2013.01); *H01L 24/45* (2013.01); *H01L 2224/04042* (2013.01); *H01L 2224/301* (2013.01);
(Continued)

(58) Field of Classification Search
CPC . H01L 23/34; H01L 23/4334; H01L 23/3128; H01L 23/31; H01L 23/367; H01L 23/00; H01L 23/498; H01L 23/3675; H01L 23/49827; H01L 23/3107; H01L 25/065; H01L 25/0655; H01L 24/09; H01L 24/32; H01L 24/49; H01L 24/73
USPC ....... 257/712, 706, 778, 713, 777, 686, 723, 257/675, 717, 784, 720, 707
See application file for complete search history.

(56) References Cited

U.S. PATENT DOCUMENTS 5,552,635 A * 9/1996 Kim ........................ H01L 23/42
257/706
6,236,568 B1 * 5/2001 Lai ...................... H01L 23/4334
165/80.3
(Continued)

FOREIGN PATENT DOCUMENTS

JP 2005-223008 A 8/2005
JP 2012-033559 A 2/2012

*Primary Examiner* — Chuong A Luu
(74) *Attorney, Agent, or Firm* — McGinn IP Law Group, PLLC (57) ABSTRACT

A semiconductor device with improved heat radiation characteristics. It includes: a wiring board having a chip mounting surface and a plurality of electrode pads formed over the chip mounting surface; a semiconductor chip located over the chip mounting surface of the wiring board, having a plurality of bonding pads; a plurality of wires for coupling the electrode pads and the bonding pads; a heat slug located over the semiconductor chip; and a sealing member covering the chip mounting surface of the wiring board, the semiconductor chip, the wires, and the heat slug. A spacer lies between the chip mounting surface of the wiring board and the semiconductor chip and the sealing member lies between the semiconductor chip and the heat slug.

22 Claims, 6 Drawing Sheets (51) Int. Cl.
*H01L 23/31* (2006.01)
*H01L 25/065* (2006.01)
*H01L 23/433* (2006.01)
*H01L 23/498* (2006.01)

(52) U.S. Cl.
CPC ............... *H01L 2224/45144* (2013.01); *H01L 2224/45147* (2013.01); *H01L 2224/48227* (2013.01); *H01L 2224/73265* (2013.01); *H01L 2924/10253* (2013.01); *H01L 2924/13091* (2013.01); *H01L 2924/1511* (2013.01)

(56) References Cited

U.S. PATENT DOCUMENTS

| | | | |
|---|---|---|---|
| 6,534,859 B1 * | 3/2003 | Shim | H01L 23/3128 257/675 |
| 7,071,550 B2 | 7/2006 | Sato | |
| 2005/0167849 A1 * | 8/2005 | Sato | H01L 23/3121 257/778 |
| 2007/0205495 A1 * | 9/2007 | Fernandez | H01L 23/3128 257/686 |
| 2012/0025367 A1 * | 2/2012 | Imaizumi | H01L 23/4334 257/712 |

* cited by examiner

SEMICONDUCTOR DEVICE

CROSS-REFERENCE TO RELATED APPLICATIONS

The disclosure of Japanese Patent Application No. 2014-191224 filed on Sep. 19, 2014 including the specification, drawings and abstract is incorporated herein by reference in its entirety.

BACKGROUND

The present invention relates to semiconductor devices and more particularly to technology for a semiconductor device with a plurality of semiconductor chips mounted over a wiring board.

Japanese Unexamined Patent Application Publication No. 2005-223008 discloses a semiconductor module in which a power MOS chip (control-side element) 5, a power MOS chip (synchronous rectification side element), and a drive IC chip 9 for driving the gates of the MOSFETs formed on these chips are mounted on amounting board 3 by flip-chip bonding. In the module, a heat sink 53 is disposed on the back of the power MOS chip 5 and the heat sink 53 extends to a position where the heat sink 53 covers the drive IC chip 9. The power MOS chip 5 and the drive IC chip 9 are encapsulated into a single package with a resin material 61.

Japanese Unexamined Patent Application Publication No. 2012-33559 discloses a semiconductor device 200 which includes a substrate 101, a semiconductor element 103 disposed on the substrate, a heat radiating member 107 disposed over the semiconductor element through a spacer 201, and a sealing member 105 covering an upper part of the substrate 101, the semiconductor element 103, the spacer 201, and the heat radiating member 107 (see FIG. 5). It also discloses a semiconductor device 600 which includes a plurality of semiconductor chips (elements) 103 disposed side by side over a semiconductor substrate 101, a heat radiating member 107 disposed over the semiconductor chips 103 through adhesives 102A, and a sealing member 105 covering an upper part of the substrate 101, the semiconductor chips 103, and the heat radiating member 107 (see FIGS. 20A and 20B).

SUMMARY

The present inventors examined a semiconductor device which includes a wiring board, a first and a second semiconductor chip disposed planarly side by side over the wiring substrate through an adhesive, a plurality of wires for coupling a plurality of terminals formed on the upper surface of the wiring board and bonding pads of the first and second semiconductor chips, and a sealing member covering the first and second semiconductor chips and the wires with resin. As a result, the inventors found the following problem. In particular, the inventors examined the heat radiation structure of the above semiconductor device. In the semiconductor device examined by the inventors, the operation guarantee temperature for the first and second semiconductor chips is set at 125° C. or less.

The present inventors first examined the structure in which one heat slug is placed over the upper surface of the first semiconductor chip and the upper surface of the second semiconductor chip, each through an adhesive, a spacer, and an adhesive.

The first semiconductor chip and the second semiconductor chip each have a rectangular upper surface and the size of the upper surface of the first semiconductor chip is 6×8 mm and the size of the upper surface of the second semiconductor chip is 2.5×3.5 mm. A plurality of bonding pads are arranged in a staggered pattern on the upper surfaces of the first semiconductor chip and second semiconductor chip along the periphery (sides) of the upper surfaces, so the area in which a spacer can be mounted is smaller than the sizes of the upper surfaces of the first semiconductor chip and second semiconductor chip. An estimation reveals that the spacer overlying the first semiconductor chip should be a rectangular parallelepiped measuring 4.5×6.5×0.4 (thickness) mm and the spacer overlying the second semiconductor chip should be a rectangular parallelepiped measuring 1×2×0.5 (thickness) mm. Also, as a result of a further examination, the following problems have been found.

Firstly, the inventors have found the following problem: since the spacer to be mounted over the upper surface of the second semiconductor chip is small, the working efficiency in mounting (placing and bonding) the spacer over the upper surface of the second semiconductor chip is considerably low and mounting work cannot be done stably, resulting in a low manufacturing yield.

Secondly, the present inventors have found the following problem as a result of examining the structure in which two heat slugs are placed separately over the upper surfaces of the first semiconductor chip and second semiconductor chip through an adhesive, a spacer, and an adhesive. In this structure, since the bottom area (1×2 mm) of the spacer over the second semiconductor chip is small and the area of adhesion between the spacer and the heat slug is small, the bottom area of the heat slug to be placed over the second semiconductor chip cannot be large enough to achieve the desired operation guarantee temperature. If the bottom area of the heat slug is increased, the heat slug might be inclined. Furthermore, it has been found that peeling might occur between the heat slug and the spacer or between the spacer and the second semiconductor chip.

An object of the present invention is to provide technology for improving the heat radiation characteristics of a semiconductor device with semiconductor chips mounted over a wiring board.

The above and further objects and novel features of the invention will more fully appear from the following detailed description in this specification and the accompanying drawings.

A main aspect of the present invention which will be disclosed herein is briefly outlined below.

According to one aspect of the present invention, there is provided a semiconductor device which includes: a wiring board having a chip mounting surface and a plurality of electrode pads formed on the chip mounting surface; a semiconductor chip located over the chip mounting surface of the wiring board, having a plurality of bonding pads; a plurality of wires for coupling the electrode pads and the bonding pads; a heat slug located over the semiconductor chip; and a sealing member covering the chip mounting surface of the wiring board, the semiconductor chip, the wires, a first spacer, and the heat slug. The spacer lies between the chip mounting surface of the wiring board and the semiconductor chip and the sealing member lies between the semiconductor chip and the heat slug.

The following is a brief description of the advantageous effects achieved by the main aspect of the invention.

According to the present invention, the heat radiation characteristics of the semiconductor device are improved.

DETAILED DESCRIPTION

Rules of Description in the Specification

The preferred embodiments of the present invention may be described separately in different sections as necessary or for convenience sake, but the embodiments described as such are not irrelevant to each other unless otherwise expressly stated. Regardless of the order in which they are described, one embodiment may be, in part, a detailed form of another, or one embodiment may be, in whole or in part, a variation of another. Basically, descriptions of the same elements or things are not repeated. In the preferred embodiments, when a specific numerical value is indicated for an element, the numerical value is not essential for the element unless otherwise expressly stated or unless theoretically limited to the numerical value or unless obviously the context requires the element to be limited to the specific value.

In description of a material or composition in an embodiment of the invention, the expression "X comprising A" does not exclude a material or composition which includes an element other than A unless otherwise expressly stated or unless obviously the context requires exclusion of another element. If the expression concerns a component, it means "X which contains A as a main component". For example, the term "silicon member" obviously refers to not only a member made of pure silicon but also a member made of SiGe (silicon germanium) alloy or another type of multi-component alloy which contains silicon as a main component or a member which contains another additive. Similarly, for example, the terms "gold plating," "Cu layer," and "nickel plating" obviously refer to not only members made of pure gold, Cu and nickel but also members made of multi-component materials which contain gold, Cu and nickel as main components respectively.

Also, even when a specific numerical value or quantity is indicated for an element, the numerical value or quantity of the element may be larger or smaller than the specific numerical value or quantity unless otherwise expressly stated or unless theoretically limited to the specific value or quantity or unless the context requires the element to be limited to the specific value or quantity.

In all the drawings that illustrate the preferred embodiments, the same or similar elements are designated by the same or similar reference signs or numerals and basically descriptions thereof are not repeated.

Regarding the accompanying drawings, hatching or the like may be omitted even in a cross section diagram if hatching may cause the diagram to look complicated or it is easy to distinguish the area concerned from an air gap. In connection with this, background contour lines may be omitted even for a closed hole in a plan view if the contour of the hole is apparent from an explanation, etc. Furthermore, even if a drawing does not show a cross section, hatching or a dot pattern may be added to clarify that the area concerned is not an air gap or to show the border of the area clearly.

The preferred embodiments will be described below by taking a semiconductor device in which a SoC (System on a Chip) chip incorporating a CPU (Central Processing Unit) core, memory core, graphic core, and interface core, and a PHY (Physical Layer) chip incorporating a D/A converter circuit, etc. are disposed side by side over a wiring board, as an example of a BGA (Ball Grid Array) semiconductor device. In this semiconductor device, for example, data from the SoC chip can be converted into a light signal (or electric signal) through the PHY chip and sent to an optical fiber (or twisted pair). Also, data from the optical fiber (or twisted pair) can be sent to the SoC chip. Therefore, inside the semiconductor device (the surface of the wiring board), a plurality of wirings for electrically coupling the SoC chip and the PHY chip directly are disposed so that, for example, data from the SoC chip is sent to the PHY chip through the wirings.

First Embodiment

<Semiconductor device>

Figure 1:
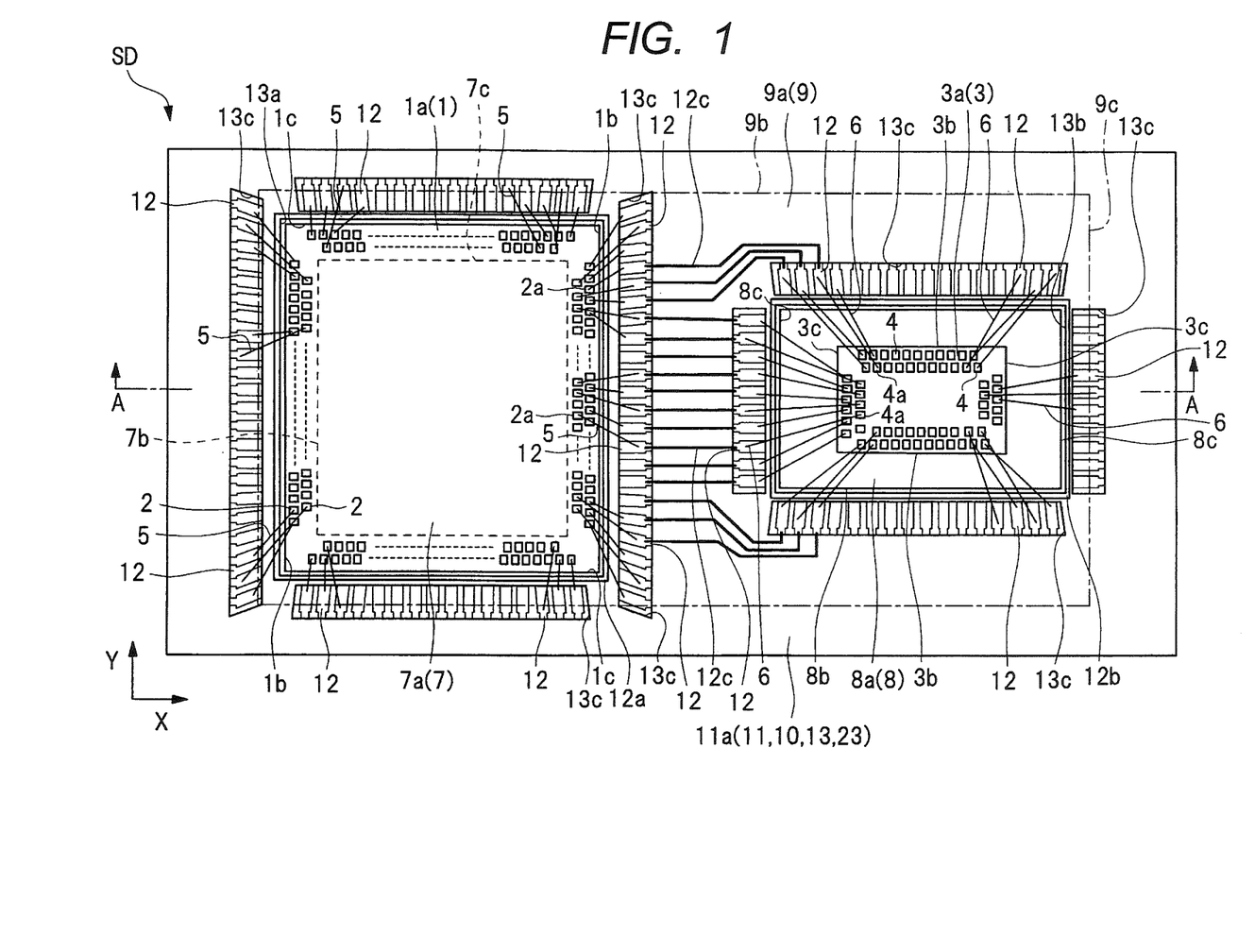
FIG. 1 is a plan view showing the upper surface side internal structure of a semiconductor device according to a first embodiment of the present invention.
Figure 2:
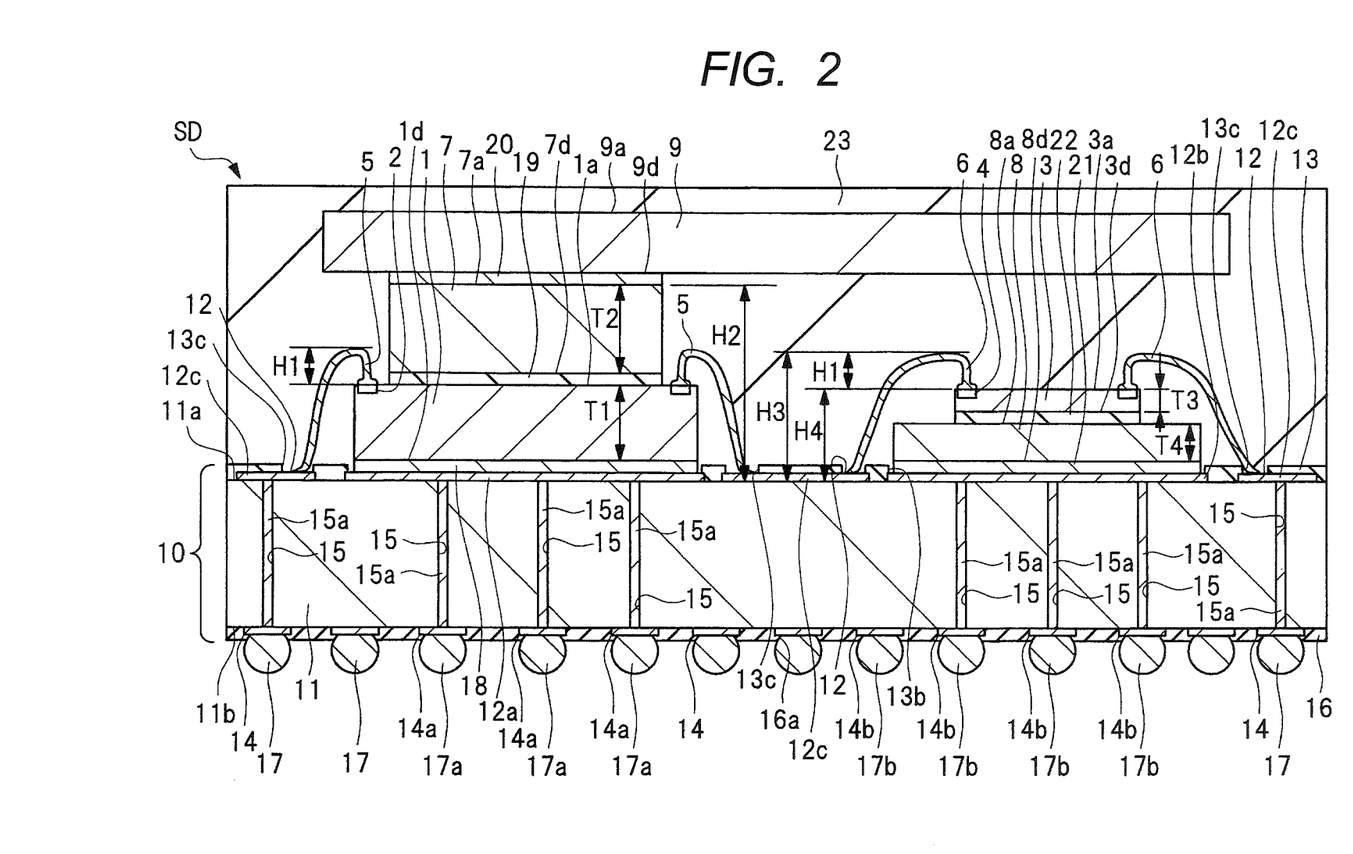
FIG. 2 is a sectional view taken along the line A-A of FIG. 1.

This embodiment concerns a BGA (Ball Grid Array) semiconductor device. FIG. 1 is a plan view showing the upper surface side internal structure of the BGA semiconductor device and FIG. 2 is a sectional view taken along the line A-A of FIG. 1.

The semiconductor device SD according to this embodiment includes: a wiring board 10; a semiconductor chip 1 mounted over the wiring board 10; a spacer 7 mounted over the semiconductor chip 1; a heat slug 9 mounted over the spacer 7; a spacer 8 mounted in an area different from the area of the semiconductor chip 1 over the wiring board 10; a semiconductor chip 3 mounted over the spacer 8; a plurality of wires 5 for coupling the semiconductor chip 1 and the wiring board 10 electrically; a plurality of wires 6 for coupling the semiconductor chip 3 and the wiring board 10 electrically; and a sealing member (sealing resin) 23 for sealing the semiconductor chips 1 and 3, spacers 7 and 8, wires 5 and 6 and heat slug 9.

First, the wiring board 10 of the semiconductor device SD will be described referring to FIGS. 1 and 2. The wiring board 10 includes a core layer (insulating layer, core insulating layer) 11 having an upper surface (chip mounting surface, front surface) 11a and a lower surface (packaging surface, back surface) 11b opposite to the upper surface 11a. The core layer 11 is, for example, a resin board with an insulating layer of glass epoxy resin, etc.

A plurality of terminals (bonding leads, electrode pads) 12, a plurality of wirings (upper wirings) 12c electrically coupled to the terminals 12 respectively, a semiconductor chip mounting layer 12a, and a spacer mounting layer 12b are formed on the upper surface 11a of the core layer 11. The terminals 12, wirings 12c, semiconductor chip mounting layer 12a, and spacer mounting layer 12b are made of, for example, copper (Cu) with a coating layer (not shown) formed on the copper surface, and for example, a nickel (Ni) film and a gold (Au) film over the nickel (Ni) film are stacked. A plurality of lands (terminals, electrode pads) 14 and a plurality of heat radiation lands 14a and 14b are formed on the lower surface 11b of the core layer 11. The lands 14 and heat radiation lands 14a and 14b are made of copper (Cu), and a coating layer, for example, of a nickel (Ni) film is formed on the surface of the copper (not shown). As shown in FIG. 2, vias (holes) 15 are made in the core layer 11, extending from the upper surface 11a to the lower surface 11b, and the wirings 12c and the lands 14 are electrically coupled through wirings (via inside wirings, via inside conductors) 15a as conductors formed in these vias 15, respectively. The semiconductor chip mounting layer 12a is electrically coupled to the heat radiation lands 14a through the wirings 15a underlying it. The spacer mounting layer 12b is electrically coupled to the heat radiation lands 14b through the wirings 15a underlying it.

As shown in FIG. 1 or 2, an insulating film (upper surface insulating film, solder resist film) 13 of insulating resin is formed on the upper surface 11a of the core layer 11 and the wirings 12c are covered by the insulating film 13. A plurality of openings 13c are made in a way to overlap the terminals 12 and the terminals 12 are exposed from the insulating film 13 in the openings 13c. An opening 13a is made in the insulating film 13 in a way to overlap the semiconductor chip mounting layer 12a and the semiconductor chip mounting layer 12a is exposed from the insulating film 13 in the opening 13a. An opening 13b is made in the insulating film 13 in a way to overlap the spacer mounting layer 12b and the spacer mounting layer 12b is exposed from the insulating film 13 in the opening 13b. As shown in FIG. 2, like the insulating film 13, an insulating film (lower surface insulating film, solder resist film) 16 of insulating resin is formed on the lower surface 11b of the core layer 11. The insulating film 16 has a plurality of openings 16a made in a way to overlap the lands 14 and the heat radiation lands 14a and 14b respectively, and the lands 14 and the heat radiation lands 14a and 14b are exposed from the insulating film 16 in the openings 16a. The exposed portions of the lands 14 and heat radiation lands 14a and 14b are respectively bonded to a plurality of solder members (solder balls) 17, 17a, and 17b which are used as external electrode terminals for mounting the semiconductor device SD over a packaging substrate (not shown). The lands 14 are coupled to the solder members 17, the heat radiation lands 14a are coupled to the solder members 17a, and the heat radiation lands 14b are coupled to the solder members 17b. Alternatively, the lands 14, 14a, and 14b may be used as external electrode terminals without the solder members 17, 17a, and 17b.

FIG. 2 shows an example of the wiring board 10 which has two wiring layers with wiring patterns made on the upper surface 11a and lower surface 11b of the core layer 11. However, the number of wiring layers of the wiring board 10 is not limited to 2. For example, the wiring board 10 may be a multilayer wiring board which has a plurality of wiring layers (wiring patterns) in the core layer 11.

The planar shape of the upper surface 11a and lower surface 11b of the core layer 11 (namely the upper and lower surfaces of the wiring board 10) is quadrangular.

Next, the semiconductor chip 1 of the semiconductor device SD will be described referring to FIGS. 1 and 2.

The semiconductor chip 1 is a SoC chip which has a rectangular upper surface (main surface, front surface) 1a which measures 6×8 mm. A plurality of semiconductor elements (not shown) including a MISFET (Metal Insulator Semiconductor Field Effect Transistor) are formed on the upper surface 1a of the semiconductor chip 1 of silicon (Si) to configure a CPU core, memory core, graphic core and interface core. The rectangular upper surface 1a has two long sides 1b and two short sides 1c. A plurality of bonding pads 2 are arranged along the two long sides 1b and two short sides 1c over the upper surface 1a and the bonding pads 2 are arranged in two rows in a staggered pattern along the four sides. The semiconductor chip 1 is a rectangular parallelepiped which has a lower surface (back surface) 1d opposite to the upper surface 1a, and its thickness T1 (for example, 0.30 mm) corresponds to the distance from the upper surface 1a to the lower surface 1b.

The semiconductor chip 1 is mounted over the semiconductor chip mounting layer 12a formed on the upper surface 11a of the wiring board 10 through a bonding layer 18. The bonding layer 18 is a conductive paste such as a silver paste. As shown in FIG. 1, the semiconductor chip mounting layer 12a is larger (wider) than the short side 1c in the X direction and larger (wider) than the long side 1b in the Y direction. Specifically, in plan view, the two long sides 1b and two short sides 1c all lie over and overlap the semiconductor chip mounting layer 12a. Since the opening 13a in the insulating film 13 is also larger than the lower surface 1d of the semiconductor chip 1, the entire lower surface 1d of the semiconductor chip 1 is bonded to the semiconductor chip mounting layer 12a through the bonding layer 18 and electrically coupled to it. This improves the electrical stability and heat radiation characteristics of the semiconductor chip 1. The thickness of the bonding layer 18 is 0.01 mm to 0.03 mm.

The bonding pads 2 formed on the upper surface 1a of the semiconductor chip 1 and the terminals 12 formed on the upper surface 11a of the wiring board 10 are electrically coupled by wires 5. The wires 5 may be gold (Au) wires or copper (Cu) wires. When the bonding pads 2 are arranged in a staggered pattern along the long sides 1b or short sides 1c of the semiconductor chip 1, the wires 5 coupled to the outer bonding pads 2 (nearer to the long sides 1b or short sides 1c) of the semiconductor chip 1 are smaller in height from the upper surface 1a of the semiconductor chip 1 and the wires 5 coupled to the inner bonding pads 2 (remoter from the long sides 1b or short sides 1c) are larger in height from the upper surface 1a of the semiconductor chip 1. This prevents the wires 5 coupled to the inner bonding pads 2 from being shorted with the wires 5 coupled to the outer bonding pads 2. FIG. 2 shows the wires 5 coupled to the inner bonding pads 2, in which the maximum height of the wires 5 from the upper surface 1a of the semiconductor chip 1 in the thickness direction of the semiconductor chip 1 is designated by H1.

Next, the spacer 7 mounted over the upper surface 1a of the semiconductor chip 1 will be described referring to FIGS. 1 and 2.

The spacer 7 has a function to prevent shorting between the wires 5 and the heat slug 9 and a function to transfer the heat generated by the semiconductor chip 1 to the heat slug 9.

In FIG. 1, the outline of the spacer 7 is indicated by dotted lines. The spacer 7 is located in the center of the upper surface 1a of the semiconductor chip 1. In other words, the spacer 7 lies in the area between the bonding pads 2 arranged in a staggered pattern along the two long sides 1b or two short sides 1c of the semiconductor chip 1. In plan view, the spacer 7 does not overlap the bonding pads 2 and wires 5. The spacer 7 is a rectangular parallelepiped and has a rectangular upper surface 7a and a rectangular lower surface 7d (FIG. 2). The upper surface 7a and lower surface 7d of the spacer 7 each have two long sides 7b and two short sides 7c and measure 4.5×6.5 mm. The upper surface 7a and lower surface 7d of the spacer 7 are large enough to improve the heat transfer function, to the extent that they do not interfere with the bonding pads 2 and the wires 5.

As shown in FIG. 2, the spacer 7 is mounted over the upper surface 1a of the semiconductor chip 1 through an adhesive 19. The adhesive 19 is a film adhesive which includes a base resin film called DAF (Die Attach Film) and adhesive layers on the both sides of the resin film. The thickness of the adhesive 19 is 0.01 mm to 0.02 mm. At the time of bonding the spacer 7 to the upper surface 1a of the semiconductor chip 1, when the film adhesive is used, the spread (overflow) of the adhesive 19 is smaller than when, for example, a conductive paste is used, so that the size of the upper surface 7a and lower surface 7d of the spacer 7 may be increased to improve the heat transfer function. Furthermore, in order to perform the function to prevent shorting, the thickness T2 of the spacer 7 (for example, 0.35 mm) is made larger than the maximum height H1 of the wires 5 so that the wires 5 do not contact the heat slug 9 (T2>H1). From the viewpoint of thermal expansion coefficient and thermal conductivity, preferably the spacer 7 should be made of silicon (Si), the same material as the material of the semiconductor chip 1, but it may be made of copper (Cu). As will be mentioned later, the spacer 7 has the function to prevent shorting between the wires 6 coupled to the semiconductor chip 3 and the heat slug 9.

Next, the semiconductor chip 3 will be described referring to FIGS. 1 and 2.

The semiconductor chip 3 is a PHY chip which has a rectangular upper surface (main surface, front surface) 3a and the size of the upper surface 3a is about 2.5×3.5 mm. A plurality of semiconductor elements including a MISFET (Metal Insulator Semiconductor Field Effect Transistor) (not shown) are formed on the upper surface 3a of the semiconductor chip 3 of silicon (Si) to configure a D/A converter circuit, etc. The rectangular upper surface 3a has two long sides 3b and two short sides 3c. A plurality of bonding pads 4 are arranged along the two long sides 3b and two short sides 3c over the upper surface 3a and the bonding pads 4 are arranged in a staggered pattern along the four sides. The semiconductor chip 3 is a rectangular parallelepiped which has a lower surface (back surface) 3d opposite to the upper surface 3a, and its thickness T3 (for example, 0.15 mm) corresponds to the distance from the upper surface 3a to the lower surface 3b.

The semiconductor chip 3 is mounted over the spacer mounting layer 12b formed on the upper surface 11a of the wiring board 10 through a spacer 8.

As shown in FIGS. 1 and 2, the bonding pads 4 formed on the upper surface 3a of the semiconductor chip 3 and the terminals 12 formed on the upper surface 11a of the wiring board 10 are electrically coupled by wires 6. There is a case where the wire 6 is not shown in the figure. In this case, the bonding pads 4 and the terminals 12 are all coupled by the wires 6, because the figures only show some of the wires 6. The wires 6 may be gold (Au) wires or copper (Cu) wires. Since the bonding pads 4 are arranged in a staggered pattern, the wires 6 coupled to the outer bonding pads 4 (nearer to the long sides 3b or short sides 3c) are smaller in height from the upper surface 3a of the semiconductor chip 3 and the wires 6 coupled to the inner bonding pads 4 (remoter from the long sides 3b or short sides 3c) are larger in height from the upper surface 3a of the semiconductor chip 3. This prevents the wires 6 coupled to the inner bonding pads 4 from being shorted with the wires 6 coupled to the outer bonding pads 4. FIG. 2 shows the wires 6 coupled to the inner bonding pads 4, in which the maximum height of the wires 6 from the upper surface 3a of the semiconductor chip 3 in the thickness direction of the semiconductor chip 3 is designated by H1.

Next, the spacer 8 which lies between the wiring board 10 and the semiconductor chip 3 will be described referring to FIGS. 1 and 2.

The semiconductor chip 3 is mounted over the upper surface 8a of the spacer 8 through an adhesive 22 and the spacer 8 is mounted over the spacer mounting layer 12b formed on the upper surface 11a of the wiring board 10 through an adhesive layer 21. Like the adhesive 18, the adhesive layer 21 is a conductive paste such as a silver paste, and like the adhesive 19, the adhesive 22 is a film adhesive. The thickness of the adhesive 21 is 0.01 mm to 0.02 mm and the thickness of the adhesive 22 is 0.01 mm to 0.03 mm. The spacer 8 is a rectangular parallelepiped and has a rectangular upper surface 8a and a rectangular lower surface 8d (FIG. 2). The upper surface 8a and lower surface 8d of the spacer 8 each have two long sides 8b and two short sides 8c and measure 4.5×5.7 mm. The spacer 8 has a thickness T4 (for example, 0.15 mm) and from the viewpoint of thermal expansion coefficient and thermal conductivity, preferably it should be made of silicon (Si), the same material as the material of the semiconductor chip 3, but it may be made of copper (Cu).

As shown in FIG. 1, the semiconductor chip 3 is located in the center of the spacer 8, the long side 8b of the spacer 8 is larger than the long side 3b of the semiconductor chip 3, and the short side 8c of the spacer 8 is larger than the short side 3c of the semiconductor chip 3. The area of the upper surface 8a of the spacer 8 (specifically the lengths of the long sides 8b and short sides 8c) can be increased to the extent that shorting with the wires 6 does not occur, so that the heat generated by the semiconductor chip 3 is dissipated extensively and the heat radiation effect is increased. The area of the upper surface 8a of the spacer 8 is larger than the area of the upper surface 3a of the semiconductor chip 3.

As shown in FIG. 1, the opening 13b made in the spacer mounting layer 12b on the upper surface 11a of the wiring board 10 is wider than the spacer 8 in the X and Y directions and the entire lower surface 8d of the spacer 8 is coupled to the spacer mounting layer 12b through the adhesive 21 (FIG. 2). Therefore, the heat transferred from the semiconductor chip 3 to the spacer 8 is efficiently transferred to the wiring board 10. Naturally, the spacer mounting layer 12b is wider than the spacer 8 in the X and Y directions.

Next, the heat slug 9 will be described referring to FIGS. 1 and 2.

The heat slug 9 is a heat radiation plate which has the function to radiate the heat generated by the semiconductor chip 1 and semiconductor chip 3. Therefore, it is a metal plate of a material with high thermal conductivity, such as copper (Cu), aluminum (Al) or iron (Fe).

The heat slug 9 is a rectangular parallelepiped and has a rectangular upper surface 9a and a rectangular lower surface 9d. The upper surface 9a and lower surface 9d of the heat slug 9 each have two long sides 9b and two short sides 9c.

In FIG. 1, the outline of the heat slug 9 is indicated by alternate long and short dash lines. In plan view, the heat slug 9 entirely covers the semiconductor chip 1 and semiconductor chip 3 in the X direction (the short side 1c direction of the semiconductor chip 1, the long side 3b direction of the semiconductor chip 3) and the Y direction (the long side 1b direction of the semiconductor chip 1, the short side 3c direction of the semiconductor chip 3). Specifically, the short side 9c (Y direction) of the heat slug 9 is longer than the long side 1b of the semiconductor chip 1 and the short side 3c of the semiconductor chip 3, and the long side 9b (X direction) of the heat slug 9 is longer than the short side 1c of the semiconductor chip 1 and the long side 3b of the semiconductor chip 3.

As shown in FIG. 2, the lower surface 9d of the heat slug 9 is bonded to the upper surface 7a of the spacer 7 through an adhesive 20. The adhesive 20 is a conductive paste like the adhesives 18 and 21 and its thickness is 0.01 mm to 0.03 mm. The heat slug 9 is bonded to the spacer 7, but it is not bonded to the semiconductor chip 3. The heat slug 9 covers the entire upper surface 3a of the semiconductor chip 3 like eaves and the space between the lower surface 9d of the heat slug 9 and the upper surface 3a of the semiconductor chip 3 is filled with the sealing member 23. Also, the space between the lower surface 9d of the heat slug 9 and the wires 6 is filled with the sealing member 23.

As shown in FIG. 2, the upper surface 11a of the wiring board 10 is covered by the sealing member (sealing resin) 23 of thermosetting epoxy resin. The semiconductor chips 1 and 3, spacers 7 and 8, wires 5 and 6, and heat slug 9 which are mounted over the upper surface 11a of the wiring board 10 are also covered by the sealing member 23. In plan view, the outline of the sealing member 23 is the same as the outline of the wiring board 10. The sealing member 23 is an insulator and the epoxy resin of the sealing member 23 is an insulating material.

Next, the structure of the semiconductor device SD will be described referring to FIGS. 1 and 2.

First, the wirings which couple the semiconductor chip 1 and the semiconductor chip 3 are described below.

Inside the semiconductor device SD according to this embodiment, data is sent from the semiconductor chip 1 as a SoC chip to the semiconductor chip 3 as a PHY chip through wirings 12c formed on the upper surface 11a of the wiring board 10. As shown in FIG. 1, the bonding pads 2a of the semiconductor chip 1 for data output are arranged along one long side 1b and the bonding pads 4a of the semiconductor chip 3 for data input are arranged along one short side 3c. The one long side 1b and the one short side 3c are opposite to each other. In the X direction of FIG. 1, the one short side 3c of the semiconductor chip 3 is nearer to the one long side 1b of the semiconductor chip 1 than the other short side 3c.

The data from the semiconductor chip 1 is transferred to the semiconductor chip 3 through the bonding pads 2a, wires 5, terminals 12, wirings 12c, terminals 12, wires 6, and bonding pads 4a. Since the one long side 1b and the one short side 3c are opposite to each other, the wirings 12c for data transfer can be shortened to achieve high speed data transfer. Specifically, the terminals 12 electrically coupled to the bonding pads 2a arranged along the one long side 1b and the terminals 12 electrically coupled to the bonding pads 4a arranged along the one short side 3c are coupled by the wirings 12c extending in the direction perpendicular to the one long side 1b and the one short side 3c, so that the wirings 12 can be shortened.

The semiconductor device SD according to this embodiment has a structure A in which the semiconductor chip 3 is mounted over the wiring board 10 through the spacer 8 and the heat slug 9 is located above the semiconductor chip 3.

In the structure A, the heat generated by the semiconductor chip 3 is radiated from the wiring board 10 to the outside of the semiconductor device SD mainly through the spacer 8 and also radiated to the outside of the semiconductor device SD through the heat slug 9 located above the semiconductor chip 3.

In the structure A, the semiconductor chip 3 is nearer to the heat slug 9 by the distance equivalent to the thickness of the spacer 8 than when the semiconductor chip 3 is mounted over the wiring board 10 directly, so the efficiency in heat radiation of the semiconductor chip 3 is improved.

In the structure A, the spacer 8 is mounted over the spacer mounting layer 12b formed on the upper surface 11a of the wiring board 10 and the spacer mounting layer 12b is coupled to the heat radiation lands 14b and solder members 17b through the wirings 15a formed in the vias 15 of the wiring board 10 so that the heat radiation efficiency is improved.

In the structure A, the spacer 8 is larger than the semiconductor chip 3 in plan view, so the heat generated by the semiconductor chip 3 is planarly diffused by the spacer 8 and transferred to the wiring board 10, leading to improvement in the efficiency in heat radiation of the semiconductor chip 3. In addition, since the thickness T4 of the spacer 8 is larger than the thickness T3 of the semiconductor chip 3 (T4>T3), the thermal capacity of the spacer 8 is increased and the distance of the semiconductor chip 3 to the heat slug 9 is shortened so that the heat radiation efficiency is improved.

In the structure A, the sealing member 23 as an insulator lies between the wires 6 and the heat slug 9, thereby preventing shorting between the wires 6 and the heat slug 9.

The semiconductor device SD according to this embodiment has a structure B which includes a semiconductor chip 1 mounted over a wiring board 10; a spacer 7 located over the semiconductor chip 1; a heat slug 9 located over the semiconductor chip 1 through the spacer 7; a spacer 8 located over the wiring board 10, in an area different from the area of the semiconductor chip 1; a semiconductor chip 3 located over the spacer 8; wires 5 for coupling the semiconductor chip 1 to the wiring board 10 electrically; and wires 6 for coupling the semiconductor chip 3 to the wiring board 10 electrically.

In the structure B, the heat generated by the semiconductor chip 1 is radiated from the wiring board 10 over which the semiconductor chip 1 is mounted, to the outside of the semiconductor device SD. The heat is also radiated through the spacer 7 and the heat slug 9 to the outside of the semiconductor device SD. The heat generated by the semiconductor chip 3 is radiated through the routes described above in the explanation of the structure A.

In the structure B, the semiconductor chip 1 is mounted over the semiconductor chip mounting layer 12a formed on the upper surface 11a of the wiring board 10 and the semiconductor chip mounting layer 12a is coupled to the heat radiation lands 14a and solder members 17a through the wirings 15a formed in the vias 15 of the wiring board 10, so that the heat radiation efficiency is improved.

Next, the structure for preventing the heat slug 9 from being shorted with the wires 6 coupled to the bonding pads 4 of the semiconductor chip 3 will be described.

Here, the height of the upper surface 7a of the spacer 7, the height of the wire 6, and the height of the upper surface 3a of the semiconductor chip 3 from the upper surface 11a of the wiring board 10 as the reference plane are designated by "H2", "H3", and "H4", respectively.

Since the heat slug 9, bonded to the spacer 7 through the adhesive 20, protrudes above the semiconductor chip 3 like eaves, in order to prevent shorting between the heat slug 9 and the wire 6, the height H2 of the upper surface 7a of the spacer 7 must be larger than the height H3 of the wire 6 (H2>H3). Here, the height H2 of the upper surface 7a of the spacer 7 is larger than the height H4 of the upper surface 3a of the semiconductor chip 3 (H2>H4). Since the thicknesses of the adhesives 18, 19, 21, and 22 are far smaller than the thicknesses of the semiconductor chips 1 and 3, and spacers 7 and 8, in order to satisfy the relation of H2>H4, the sum of the thickness (film thickness) T1 of the semiconductor chip 1 and the thickness (film thickness) T2 of the spacer 7 must be larger than the sum of the thickness (film thickness) T3 of the semiconductor chip 3 and the thickness (film thickness) T4 of the spacer 8 (T1+T2>T3+T4).

In order to prevent shorting between the wire 5 and the heat slug 9, the thickness T2 of the spacer 7 must be relatively large. If the spacer 8 is too thick, shorting might occur between the wire 6 and the heat slug 9, so the spacer 8 must be relatively thin. Thus, it is important that the thickness T2 of the spacer 7 be larger than the thickness T4 of the spacer (T2>T4). As described above in the explanation of the structure A, the thickness T4 of the spacer 8 is larger than the thickness T3 of the semiconductor chip 3 (T4>T3) so that the heat radiation efficiency is improved.

Figure 3:
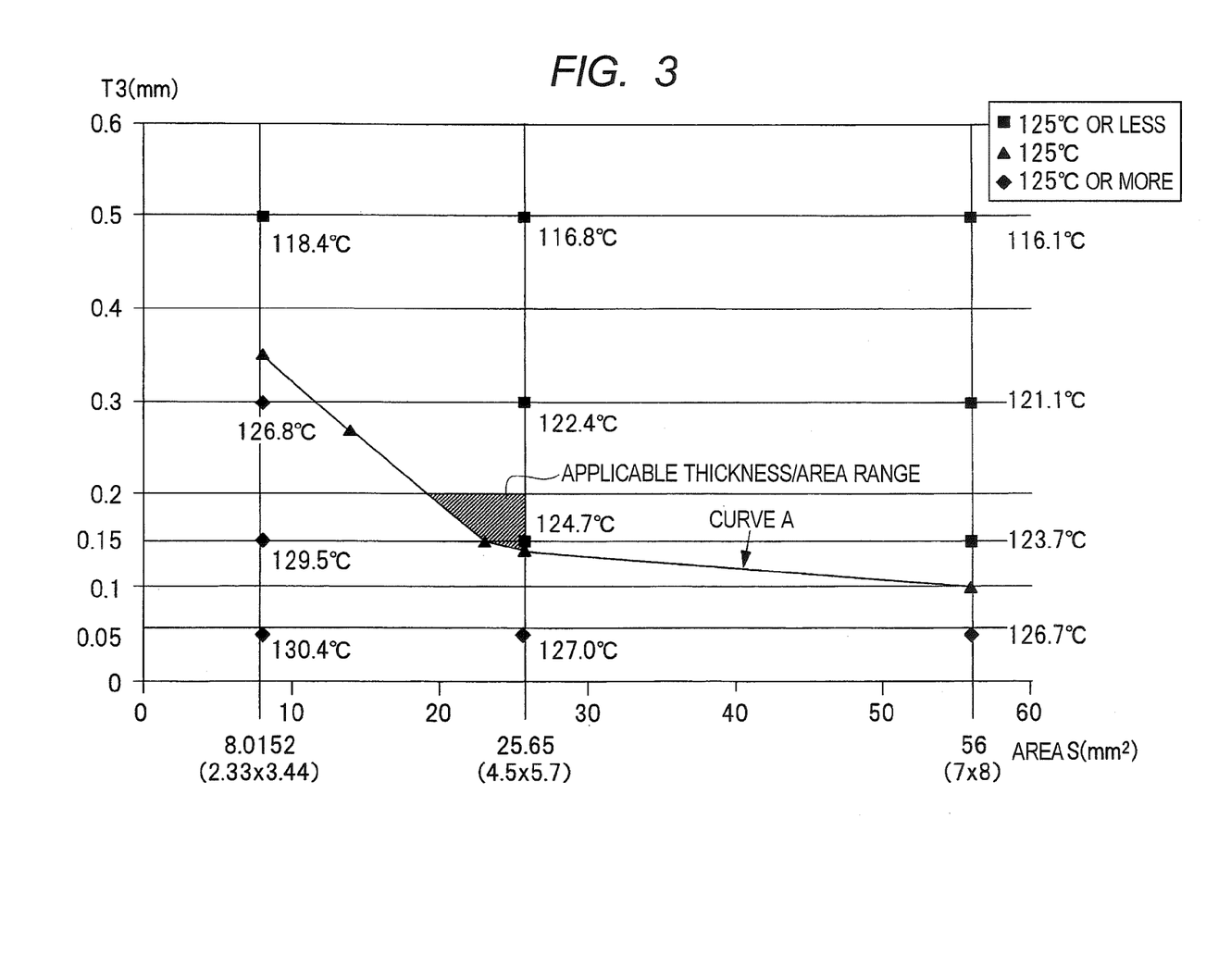
FIG. 3 is a graph showing the relation between the thickness and area of a spacer which can be used in the semiconductor device according to the first embodiment.

FIG. 3 is a graph showing the relation between the thickness and area of the spacer 8 which can be applied to the semiconductor device SD according to this embodiment.

FIG. 3 shows the operating temperature of the semiconductor chip 3 which changes with variation in the thickness T4 of the spacer 8 and the area S of the upper surface 8a of the spacer 8. Curve A is expressed by T4=f(S). In order to ensure that the operating temperature is 125° C. or less, the relation of T4≥f(S) must be satisfied. In other words, the curve A and a region above it in FIG. 3 correspond to the relation for the operating temperature of 125° C. or less. However, when the area S of the spacer 8 is large, shorting with the wire 6 might occur, so the area S must be 25.65 mm² or less (S≤25.65 mm²). When the thickness T4 of the spacer 8 is large, shorting between the wire 6 and the heat slug 9 might occur, so the thickness T4 of the spacer 8 must be 0.2 mm or less (T4≤0.2 mm). When the spacer 8 satisfies these conditions, it is applicable to the semiconductor device SD according to this embodiment. In FIG. 3, the hatched region represents the applicable thickness/area range.

Second Embodiment

The second embodiment is a variation of the first embodiment.

The second embodiment is largely different from the first embodiment in that a heat slug 91 for the semiconductor chip 1 and a heat slug 92 for the semiconductor chip 3 are provided separately.

Figure 4:
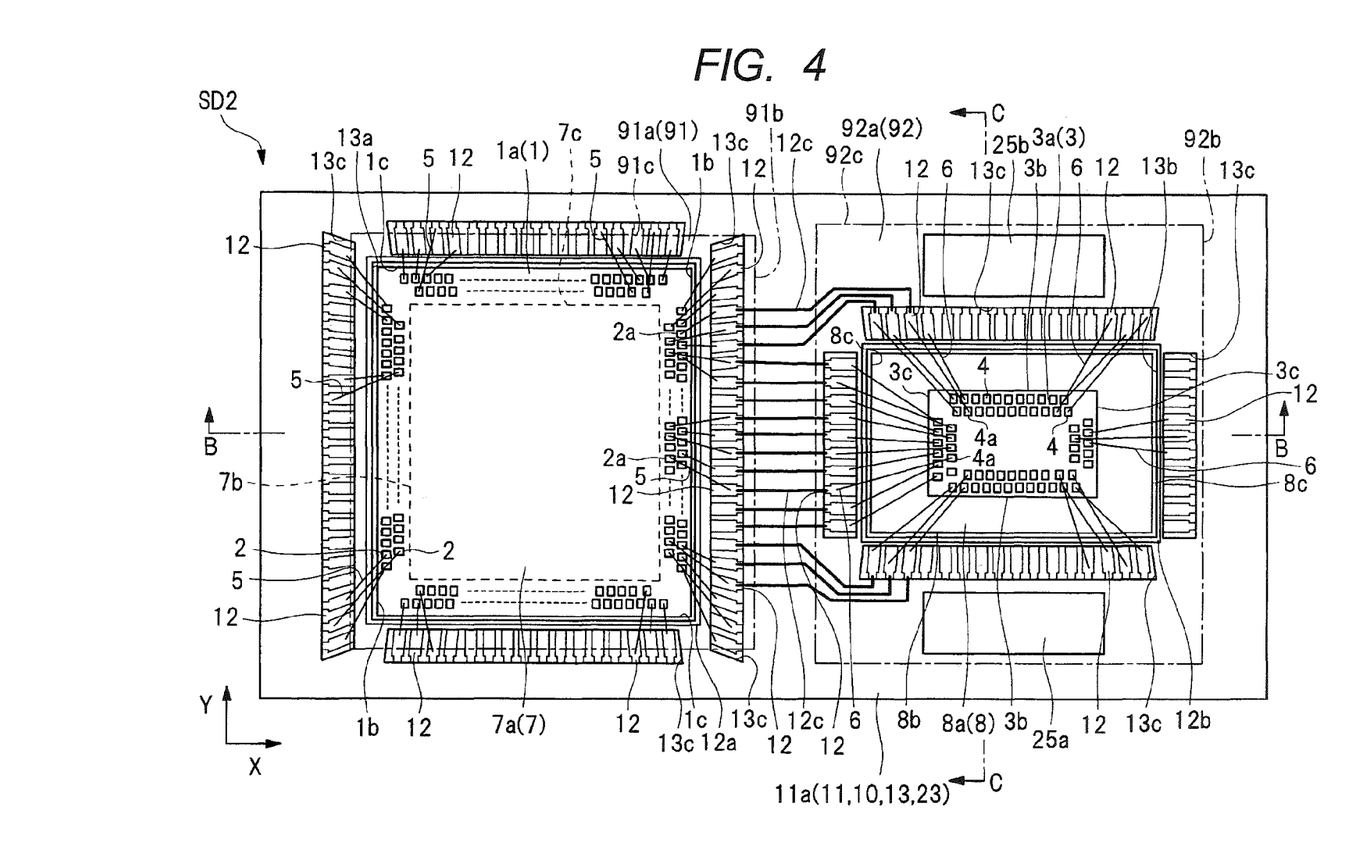
FIG. 4 is a plan view showing the upper surface side internal structure of a semiconductor device according to a second embodiment of the present invention.
Figure 5:
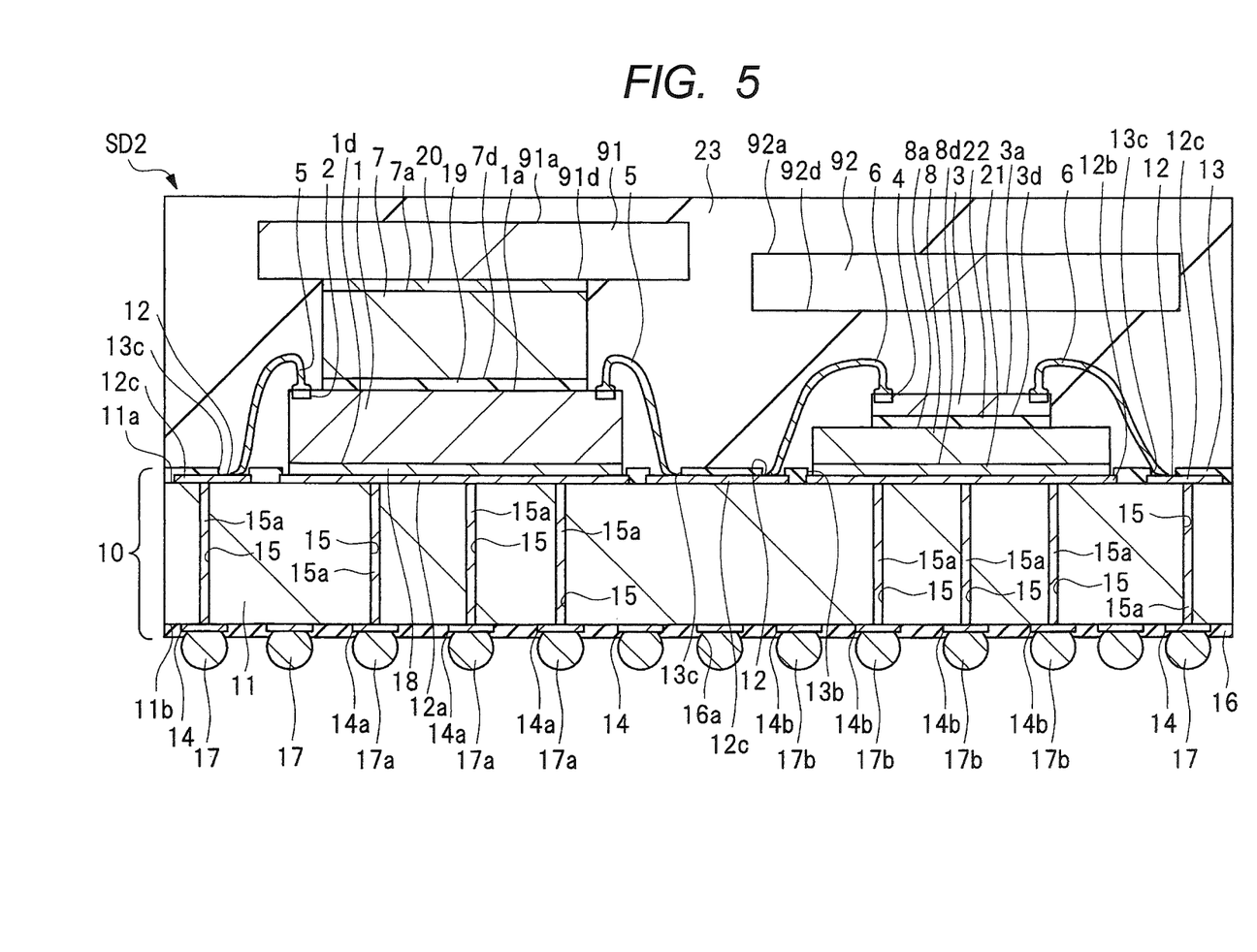
FIG. 5 is a sectional view taken along the line B-B of FIG. 4.
Figure 6:
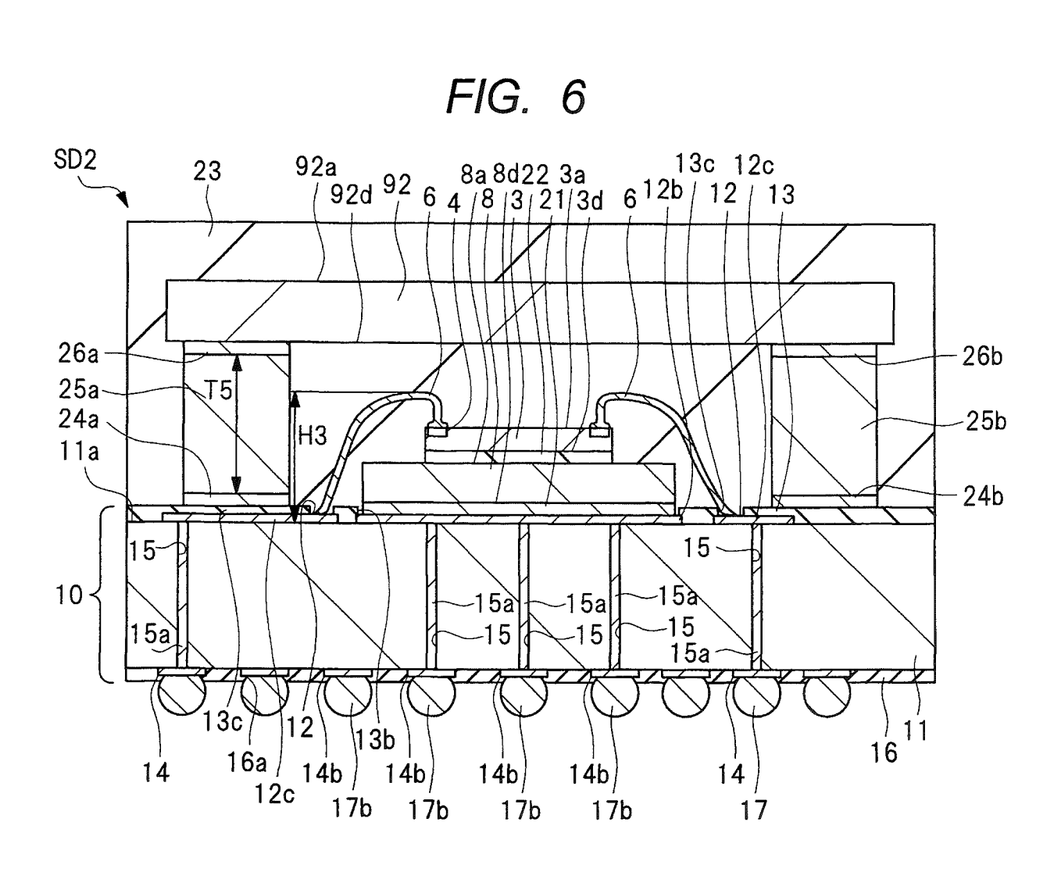
FIG. 6 is a sectional view taken along the line C-C of FIG. 4.

FIG. 4 is a plan view showing the upper surface side internal structure of a semiconductor device SD2 according to the second embodiment, FIG. 5 is a sectional view taken along the line B-B of FIG. 4, and FIG. 6 is an enlarged sectional view taken along the line C-C of FIG. 4.

FIGS. 4 and 5 correspond to FIGS. 1 and 2 for the first embodiment. The elements of the second embodiment which are different from those of the first embodiment will be described referring to FIGS. 4 and 5 and descriptions of the same elements as in the first embodiment will be omitted.

As shown in FIGS. 4 and 5, the heat slug 91 is mounted over the semiconductor chip 1 through a spacer 7. The heat slug 91 has an upper surface 91a and a lower surface 91d and the upper surface 91a is a rectangle which has two long sides 91b and two short sides 91c. In plan view, the heat slug 91 entirely covers the semiconductor chip 1 and the long sides 91b of the heat slug 91 are longer than the long sides 1b of the semiconductor chip 1 and the short sides 91c of the heat slug 91 are longer than the short sides 1c of the semiconductor chip 1. The lower surface 91d of the heat slug 91 is bonded to the upper surface 7a of the spacer 7 through an adhesive 20.

The heat slug 92 covering the semiconductor chip 3 is separate and spaced from the heat slug 91 covering the semiconductor chip 1. The heat slug 92 has an upper surface 92a and a lower surface 92d and the upper surface 92a is a rectangle which has two long sides 92b and two short sides 92c. In plan view, the heat slug 92 entirely covers the semiconductor chip 3 and the long sides 92b of the heat slug 92 are longer than the short sides 3c of the semiconductor chip 3 and the short sides 92c of the heat slug 92 are longer than the long sides 3b of the semiconductor chip 3. As shown in FIG. 4, spacers 25a and 25b are located in an area outside the semiconductor chip 3 and spacer 8 in a way to sandwich the semiconductor chip 3 and spacer 8 in the Y direction (the short side 3c direction of the semiconductor chip 3, the short side 8c direction of the spacer 8). In plan view, the spacers 25a and 25b are located in a way to overlap the heat slug 92.

As shown in FIG. 5, the heat slug 92 is spaced from the heat slug 91 and with the upper surface 11a of the wiring board 10 as the reference plane, the upper surface 92a of the heat slug 92 is lower than the upper surface 91a of the heat slug 91 and the lower surface 92d of the heat slug 92 is lower than the lower surface 91d of the heat slug 91. This difference in height between the heat slugs 91 and 92 ensures that the area between the wiring board 10 and the heat slugs 91 and 92 is adequately filled with sealing resin in the transfer molding step for forming the sealing member 23, thereby preventing generation of voids.

As shown in FIG. 6, the heat slug 92 is supported by the spacers 25a and 25b, lying above the semiconductor chip 3. The spacers 25a and 25b are made of, for example, silicon (Si), but instead it may be made of copper (Cu). The spacers 25a and 25b are bonded to the wiring board 10 by adhesives 24a and 24b and to the heat slug 92 by adhesives 26a and 26b. The adhesives 24a, 24b, 26a, and 26b may be a conductive paste like the adhesive 21, but instead they may be an insulating adhesive. When the thickness T5 of the spacers 25a and 25b is equal to, or larger than, the height H3 of the wire 6 as defined in the first embodiment, shorting between the wire 6 and the heat slug 92 is prevented. Obviously the thickness T5 of the spacers 25a and 25b is larger than the sum of the thickness T3 of the semiconductor chip 3 and the thickness of the spacer 8.

The invention made by the present inventors has been so far explained concretely in reference to the preferred embodiments thereof. However, the invention is not limited thereto and it is obvious that these details may be modified in various ways without departing from the gist thereof.

For example, the above explanation assumes that the heat slug is contained in the sealing member. However, the upper surface of the heat slug may be exposed from the sealing member.

The wiring board, heat slug, and semiconductor chips need not be rectangular in plan view. Instead, they may be square.

Some details of the above embodiments are given below.

Appendix 1

A semiconductor device which includes: a wiring board having a chip mounting surface, a packaging surface opposite to the chip mounting surface, a plurality of first electrode pads and a plurality of second electrode pads which are formed over the chip mounting surface, and a plurality of external electrode terminals formed over the packaging surface; a first semiconductor chip located over the chip mounting surface of the wiring board, having a first main surface, a back surface opposite to the first main surface, and a plurality of first bonding pads formed over the first main surface; a plurality of first wires for coupling the first electrode pads over the wiring board and the first bonding pads of the first semiconductor chip respectively; a first spacer located over the first main surface of the first semiconductor chip, having a first upper surface and a first lower surface opposite to the first upper surface; a first heat slug located over the first upper surface of the first spacer; a second spacer located in a different area from the first semiconductor chip over the chip mounting surface of the wiring board, having a second upper surface and a second lower surface opposite to the second upper surface; a second semiconductor chip located over the second upper surface of the second spacer, having a second main surface, a second back surface opposite to the second main surface, and a plurality of second bonding pads formed over the second main surface; a plurality of second wires for coupling the second electrode pads over the wiring board and the second bonding pads of the second semiconductor chip respectively; a second heat slug located over the second main surface of the second semiconductor chip; and a sealing member covering the chip mounting surface of the wiring board, the first semiconductor chip, the second semiconductor chip, the first wires, the second wires, the first spacer, the second spacer, the first heat slug, and the second heat slug, in which the sealing member lies between the second heat slug and the second main surface of the second semiconductor chip, and the first distance from the chip mounting surface of the wiring board to the first heat slug is larger than the second distance from the chip mounting surface of the wiring board to the second heat slug.

What is claimed is:

1. A semiconductor device comprising:
   a wiring board comprising:
      a chip mounting surface;
      a packaging surface opposite to the chip mounting surface;
      a plurality of electrode pads formed over the chip mounting surface; and
      a plurality of external electrode terminals formed over the packaging surface;
   a semiconductor chip located over the chip mounting surface of the wiring board, comprising:
      a main surface;
      a back surface opposite to the main surface; and
      a plurality of bonding pads formed over the main surface;
   a plurality of wires for coupling the electrode pads over the wiring board and the bonding pads of the semiconductor chip respectively;
   a first spacer located between the chip mounting surface of the wiring board and the back surface of the semiconductor chip, having an upper surface facing the semiconductor chip and a lower surface facing the wiring board;
   a heat slug located over the main surface of the semiconductor chip; and
   a sealing member covering the chip mounting surface of the wiring board, the semiconductor chip, the wires, the first spacer, and the heat slug,
   wherein the sealing member lies between the main surface of the semiconductor chip and the heat slug,
   wherein a first adhesive layer is formed between the lower surface of the spacer and the chip mounting surface of wiring board,
   wherein a second adhesive layer is formed between the upper surface of the spacer and the back surface of the semiconductor chip,
   wherein the spacer is devoid of adhesiveness, and
   wherein the semiconductor chip is not overlapped with another semiconductor chip, as projected in a plan view.

2. The semiconductor device according to claim 1, wherein, in the plan view, the heat slug entirely covers the main surface of the semiconductor chip.

3. The semiconductor device according to claim 1,
   wherein the semiconductor chip is located in a center portion of the upper surface of the first spacer, and
   wherein the upper surface of the first spacer is larger in area than the main surface of the semiconductor chip.

4. The semiconductor device according to claim 3, wherein the semiconductor chip and the first spacer are made of silicon.

5. The semiconductor device according to claim 1, wherein a film thickness of the spacer is larger than a film thickness of the semiconductor chip in a thickness direction of the semiconductor chip.

6. The semiconductor device according to claim 1, wherein the heat slug comprises a metal plate.

7. The semiconductor device according to claim 1,
   wherein the wiring board has a spacer mounting layer over the chip mounting surface, and
   wherein the first spacer is located over the spacer mounting layer.

8. The semiconductor device according to claim 7, wherein the spacer mounting layer is wider than the lower surface of the spacer in the plan view.

9. The semiconductor device according to claim 7,
   wherein the wiring board has via inside wirings extending from the chip mounting surface to the packaging surface, and
   wherein the spacer mounting layer is coupled to the external electrode terminals through the via inside wirings.

10. The semiconductor device according to claim 1, wherein the spacer comprises a first spacer, further comprising:
    a second spacer for supporting the heat slug, located, over the chip mounting surface of the wiring board, in a different area from the first spacer,
    wherein the second spacer is not overlapped with the first spacer as projected in the plan view, and
    wherein film thickness of the second spacer is larger than a sum of film thickness of the semiconductor chip and film thickness of the first spacer.

11. A semiconductor device comprising:
    a wiring board comprising:
       a chip mounting surface;
       a packaging surface opposite to the chip mounting surface;
       a plurality of first electrode pads and a plurality of second electrode pads which are formed over the chip mounting surface; and
       a plurality of external electrode terminals formed over the packaging surface;
    a first semiconductor chip located over the chip mounting surface of the wiring board, comprising:
       a first main surface;
       a back surface opposite to the first main surface; and
       a plurality of first bonding pads formed over the first main surface;
    a plurality of first wires for coupling the first electrode pads over the wiring board and the first bonding pads of the first semiconductor chip respectively;

a first spacer located over the first main surface of the first semiconductor chip, having a first upper surface and a first lower surface opposite to the first upper surface;

a heat slug located over the first upper surface of the first spacer;

a second spacer located in a different area from the first semiconductor chip over the chip mounting surface of the wiring board, having a second upper surface and a second lower surface opposite to the second upper surface;

a second semiconductor chip located over the second upper surface of the second spacer, having a second main surface, a second back surface opposite to the second main surface, and a plurality of second bonding pads formed over the second main surface;

a plurality of second wires for coupling the second electrode pads over the wiring board and the second bonding pads of the second semiconductor chip respectively; and a sealing member covering the chip mounting surface of the wiring board, the first semiconductor chip, the second semiconductor chip, the first wires, the second wires, the first spacer, the second spacer, and the heat slug, wherein the heat slug covers the second main surface of the second semiconductor chip, wherein the sealing member lies between the heat slug and the second main surface of the second semiconductor chip, wherein a first adhesive layer is formed between the second lower surface of the second spacer and the chip mounting surface of wiring board, wherein a second adhesive layer is formed between the second upper surface of the second spacer and the back surface of the second semiconductor chip, wherein the second spacer is devoid of adhesiveness, wherein the first spacer is not overlapped with the second spacer in a plan view, and wherein the first semiconductor chip is not overlapped with the second semiconductor chip, as projected in the plan view.

12. The semiconductor device according to claim 11, wherein, in the plan view, the heat slug entirely covers the first main surface of the first semiconductor chip and the second main surface of the second semiconductor chip.

13. The semiconductor device according to claim 11, wherein, in the plan view, the first upper surface of the first spacer is smaller than the first main surface of the first semiconductor chip and the second upper surface of the second spacer is larger than the second main surface of the second semiconductor chip.

14. The semiconductor device according to claim 11, wherein the first semiconductor chip, the second semiconductor chip, the first spacer, and the second spacer are made of silicon.

15. The semiconductor device according to claim 11, wherein the heat slug comprises a metal plate.

16. The semiconductor device according to claim 11, wherein a sum of a film thickness of the first semiconductor chip and a film thickness of the first spacer is larger than a sum of a film thickness of the second semiconductor chip and a film thickness of the second spacer in a thickness direction of the first semiconductor chip.

17. The semiconductor device according to claim 11, further comprising:

a third adhesive layer lying between the first main surface of the first semiconductor chip and the first lower surface of the first spacer; and a fourth adhesive layer lying between the first upper surface of the first spacer and the heat slug, wherein the third adhesive layer comprises a film adhesive, and wherein the fourth adhesive layer comprises a paste adhesive.

18. The semiconductor device according to claim 11, wherein the wiring board further includes a plurality of wirings on the chip mounting surface, wherein the first main surface of the first semiconductor chip and the second main surface of the second semiconductor chip are each a rectangle having a pair of long sides and a pair of short sides, wherein one long side of the first semiconductor chip and one short side of the second semiconductor chip are opposite to each other, wherein the first electrode pads electrically coupled to the first bonding pads arranged along the one long side and the second electrode pads electrically coupled to the second bonding pads arranged along the one short side are electrically coupled by the wirings, and wherein the wirings extend in a direction perpendicular to the one long side and the one short side.

19. The semiconductor device according to claim 11, wherein the wiring board has a chip mounting layer and a spacer mounting layer over the chip mounting surface;

wherein the first semiconductor chip is located over the chip mounting layer, and wherein the second spacer is located over the spacer mounting layer.

20. The semiconductor device according to claim 19, wherein the wiring board has first via inside wirings and second via inside wirings extending from the chip mounting surface to the packaging surface, wherein the chip mounting layer is coupled to the external electrode terminals through the first via inside wirings, and wherein the spacer mounting layer is coupled to the external electrode terminals through the second via inside wirings.

21. The semiconductor device according to claim 1, wherein the first semiconductor chip is collaterally located with the second semiconductor chip in the plan view.

22. The semiconductor device according to claim 1, wherein the first semiconductor chip is not superimposed or cover in part with the second semiconductor chip in the plan view.

* * * * *